(12) United States Patent
Kelcourse

(10) Patent No.: US 7,869,770 B2
(45) Date of Patent: Jan. 11, 2011

(54) APPARATUS, METHODS AND ARTICLES OF MANUFACTURE FOR A MULTI-BAND SWITCH

(75) Inventor: Mark F. Kelcourse, Lowell, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 1658 days.

(21) Appl. No.: 10/660,355

(22) Filed: Sep. 11, 2003

(65) Prior Publication Data

US 2004/0113747 A1  Jun. 17, 2004

Related U.S. Application Data

(60) Provisional application No. 60/434,380, filed on Dec. 17, 2002.

(51) Int. Cl.
*H04B 1/44* (2006.01)

(52) U.S. Cl. ................ 455/78; 455/82; 455/101; 455/121; 333/103; 333/101; 330/51; 330/151; 330/86

(58) Field of Classification Search .......... 455/78, 455/82, 83, 121, 101; 333/103, 104, 101; 330/51, 151, 86
See application file for complete search history.

(56) References Cited

U.S. PATENT DOCUMENTS

| | | | |
|---|---|---|---|
| 4,531,235 A | 7/1985 | Brusen | |
| 6,066,993 A * | 5/2000 | Yamamoto et al. | 333/103 |
| 6,127,886 A * | 10/2000 | Khabbaz et al. | 330/51 |
| 6,282,186 B1 | 8/2001 | Wood, Jr. | |
| 6,292,047 B1 * | 9/2001 | Traylor | 327/359 |
| 6,292,060 B1 * | 9/2001 | Yeo et al. | 330/302 |
| 6,324,211 B1 | 11/2001 | Ovard et al. | |
| 6,351,183 B1 * | 2/2002 | Khabbaz et al. | 330/51 |
| 6,366,622 B1 | 4/2002 | Brown et al. | |
| 6,396,137 B1 * | 5/2002 | Klughart | 257/691 |
| 6,483,391 B1 | 11/2002 | Magoon et al. | |
| 6,492,192 B1 | 12/2002 | O'Toole et al. | |
| 6,492,897 B1 | 12/2002 | Mowery, Jr. | |
| 6,518,855 B1 * | 2/2003 | Gerlach et al. | 333/103 |
| 6,671,496 B1 * | 12/2003 | Hoshi | 455/78 |
| 7,269,392 B2 * | 9/2007 | Nakajima et al. | 455/83 |
| 2001/0040479 A1 * | 11/2001 | Zhang | 327/427 |
| 2003/0207668 A1 * | 11/2003 | McFarland et al. | 455/3.01 |
| 2004/0141470 A1 * | 7/2004 | Kelcourse et al. | 370/282 |
| 2006/0118884 A1 * | 6/2006 | Losehand et al. | 257/376 |

FOREIGN PATENT DOCUMENTS

| | | |
|---|---|---|
| DE | 198 32 565 A1 | 8/1999 |
| WO | WO 99/46859 | 9/1999 |

\* cited by examiner

*Primary Examiner*—Matthew D Anderson
*Assistant Examiner*—April S Guzman
(74) *Attorney, Agent, or Firm*—Christopher P. Maiorana, PC

(57) ABSTRACT

A single-die multi-band switch includes a plurality of transmitter ports and a plurality of receiver ports, any one of which is selected to be connected to an antenna port. At least some of these switching topologies use a branched or cascaded switching system in order to reduce signal insertion loss. It is preferred that the individual switching elements be field effect transistors. The switching topologies employed include series-connected groups of transistors and interdigitated FETs.

16 Claims, 6 Drawing Sheets

APPARATUS, METHODS AND ARTICLES OF MANUFACTURE FOR A MULTI-BAND SWITCH

CROSS REFERENCE TO RELATED APPLICATIONS

This application claims priority to Provisional Application Ser. No. 60/434,380 filed Dec. 17, 2002, the contents of which are fully incorporated by reference herein.

FIELD OF THE INVENTION

The present invention relates generally to switched and more particularly to multi-band switches for wireless transmission and reception as fabricated on a single semiconductor chip.

BACKGROUND OF THE INVENTION

Conventional switch devices operate to control the path on which a signal travels. In general, there are two basic types of switch devices in use: electromechanical and solid state. Solid state switches use some kind of semiconductor device for the switching process, which can be diodes, field effect transistors or bipolar transistors. In general, diode switches have a lower insertion loss, while switches comprised of transistors are faster. Field effect transistors (FETs) have been employed in the switching of high frequency signals, such as radio frequencies (RF).

A FET switch is in an OFF status (high impedance) until a control voltage of a predetermined magnitude (saturation voltage) is applied to its gate. When the saturation voltage is applied to the gate, the FET switches to an ON status in which its current path between its source and drain exhibits very low resistance.

In conventional wireless switching practice (e.g. wireless LAN, Bluetooth, CDMA, TDMA, GSM, W-CDMA and the like) there has developed a need to both transmit data outward on an antenna and to receive data inward on an antenna in wireless fashion. Heretofore these tasks have been performed using different transmitter and receiver chips. It would be technically advantageous to combine these functions on a single-die integrated circuit which, however, does not unduly suffer from having its receiver ports being unduly loaded with capacitance due to the coexistence of on-chip transmitter switching circuits, and vice versa.

SUMMARY OF THE INVENTION

The present invention discloses apparatus, methods and articles of manufacture for a multi-band switch. On a single-die integrated circuit, there is implemented a transmitter switching section having a plurality of transmission ports, and a receiver switching section having a plurality of receiver ports. The transmitter and receiver ports each have associated switching topologies which are operable to switch a selected one of the ports to an antenna port, for transmission of an outbound signal or reception of an inbound signal.

At least one of the switching topologies is arranged in stages, with a first stage being proximate the antenna port and a last stage being proximate each of a plurality of the transmitter or receiver ports. One transistor, or transistor switching element consisting of several series transistors, is energized in order to pass a signal from a selected port through the last stage, and the switching element comprising the first stages in order to connect the selected port to the antenna port. The remaining portions of the last stage as well as the remaining switching topologies are deactivated so as to isolate those ports from the antenna port. In a preferred embodiment, these cascaded stages are used in switching a selected one of the receiver ports to the antenna port.

According to a preferred embodiment of the invention, the switching topologies are implemented using field effect transistors, and more preferably insulated gate n-channel field effect transistors, although other semiconductor devices can be used for the same purpose. Since the strength of the outbound transmitter signals will be substantially greater than signals received by the antenna connected to the antenna port, the transmitter port switching elements have larger switching transistors than the receiver port switching elements. In the illustrated embodiment, each transmitter port switching element includes a plurality of series-connected FETs so as to lower the saturation voltage which needs to be applied to the gates in order to put them in an "ON" state. Further, it is preferred that the main signal path transistors of the transmitter and receiver switching elements be interdigitated FETs, in which source region fingers and drain region fingers alternate within the transistor area. These interdigitated source and drain regions are spaced apart from each other by a sinuous channel region, over which is a gate metallization.

Principal technical advantages of various embodiments of the invention include the provision of a single-die integrated circuit for both the transmission and reception of wireless signals while minimizing switching element insertion loss, and the reduction of capacitive loading on the switched ports of such a chip.

BRIEF DESCRIPTION OF THE DRAWINGS

Further aspects of the invention will be discerned with reference to the following detailed description when taken in conjunction with the drawings, in which like characters are denoted by like parts and in which.

DETAILED DESCRIPTION OF ILLUSTRATED EMBODIMENT

Figure 1:
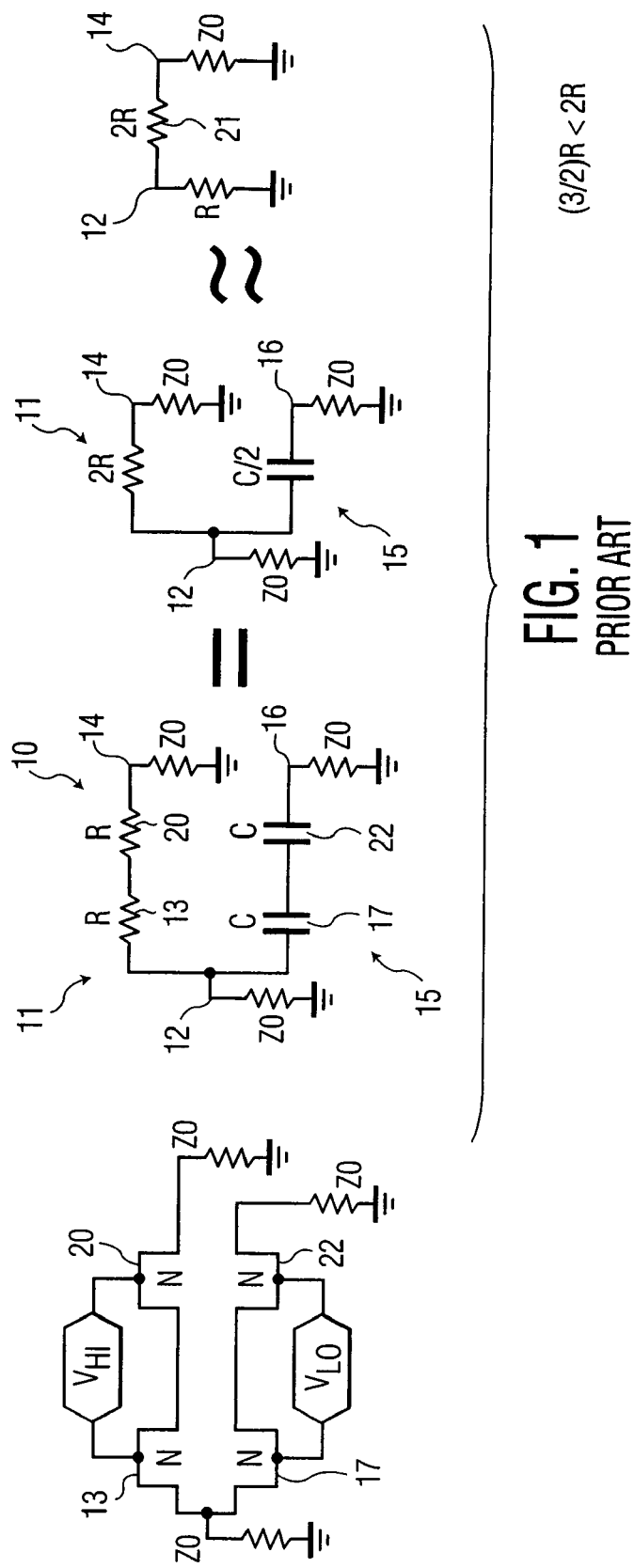
FIG. 1 is a set of schematic electrical circuit diagrams modeling the impedance of a conventional switch having two branches, two series switches per branch, with one branch in an "ON" state, according to the prior art.
Figure 2:
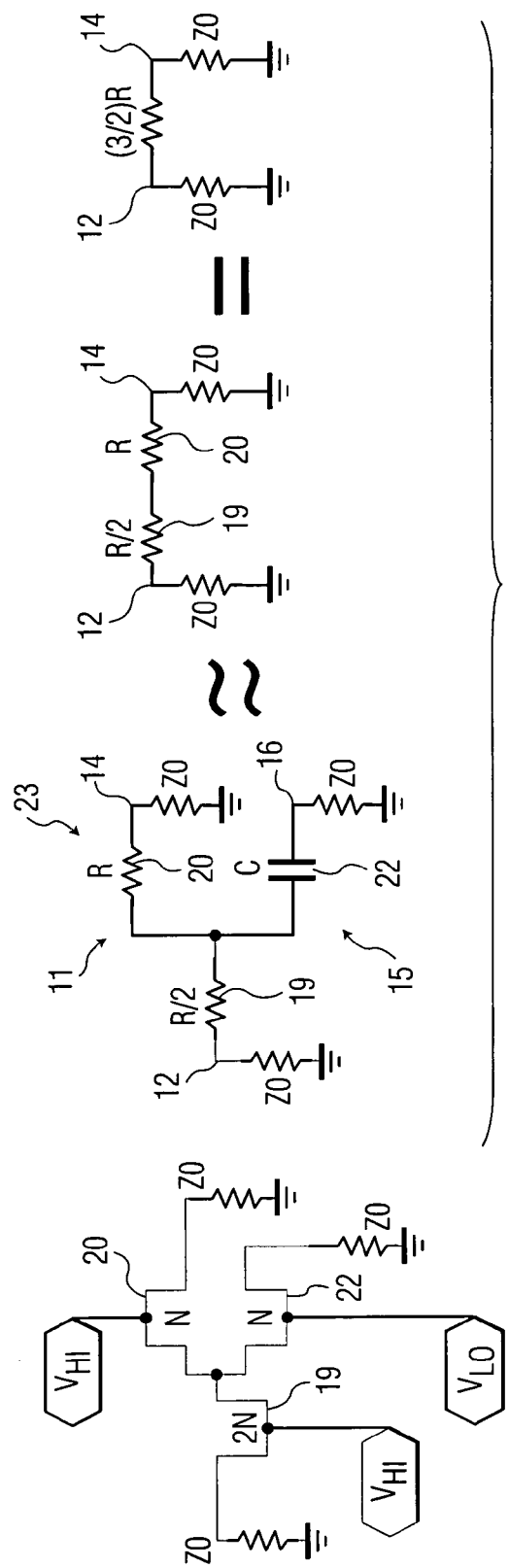
FIG. 2 is a set of schematic electrical circuit diagrams modeling the impedance of a cascaded switch according to an embodiment of the invention, with the electrical switches of one selected branch being in an "ON" state.

FIGS. 1 and 2 are sets of electrical schematic diagrams which model the impedance of a theoretical two-branch switching path according to conventional practice (FIG. 1), and according to a cascaded method used in accordance with embodiments of the present invention (FIG. 2). In FIGS. 1 and 2, one branch 11 of illustrated switch is in an ON state, permitting a signal to pass from an input 12 to an output 14. The other branch 15 leads to an output 16. Both topologies are constructed of insulated gate field effect transistors (IG-FETs). In FIG. 1, a two-branch switch indicated generally at 10 has a first branch 11 which includes two FET switches 13 and 20, here modeled as resistances with a value R. The other branch 15 has two FETs 17 and 22, which in their OFF state have dominating junction capacitances C. As shown in the first simplification, branch 11 has an equivalent resistance 2R while branch 15 has an equivalent junction capacitance C/2. Simplifying by one more step, this is approximated by an overall insertion loss 21 of 2R.

FIG. 2 shows a switching schema having the same objective in which a signal propagates through the same number of switches or transistors as appear in the circuit in FIG. 1. But cascaded switch 23 has a large capacity FET 19 with a gate perimeter that is twice that of e.g. FET 20, therefore contributing an ON resistance of R/2. This FET 19 takes the place of branch FETs 13 and 17 in FIG. 1. ON FET 20 exhibits a resistance R, while OFF FET 22 shows a junction capacitance C. The first simplification of this circuit neglects the capacitance of FET 22, leaving R/2 and R in series. As is shown in the last simplification, this reduces to an equivalent insertion loss of 3/2 R, which is less than the 2R insertion loss exhibited by the circuit of FIG. 1.

Figure 3:
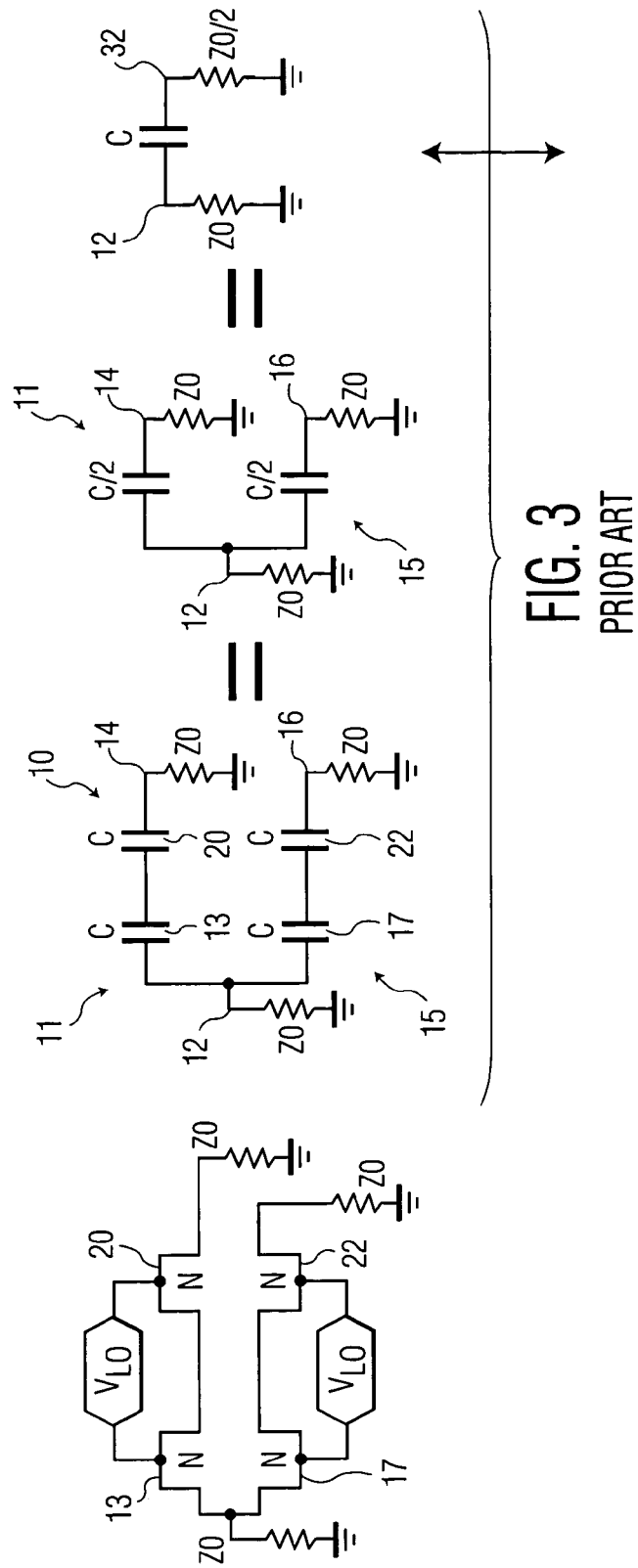
FIG. 3 is a set of schematic electrical circuit diagrams modeling the impedance of the circuit illustrated in FIG. 1, with both branches being in an "OFF" state.
Figure 4:
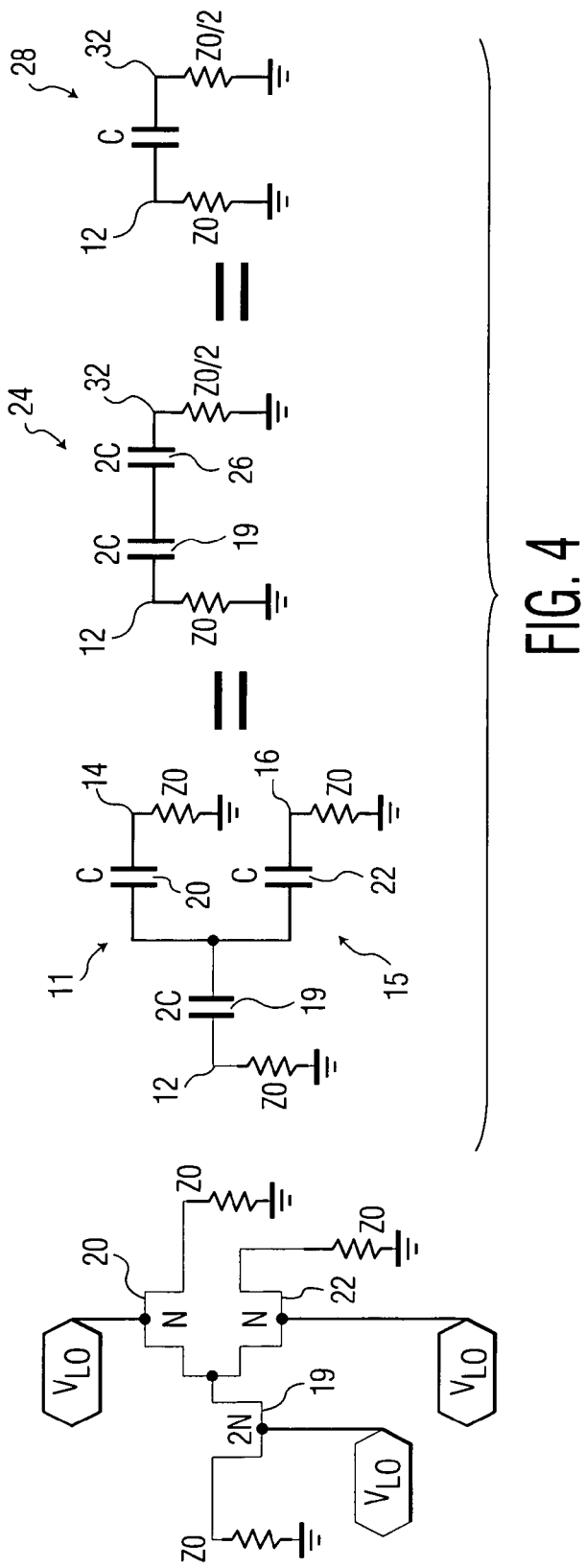
FIG. 4 is a set of schematic electrical circuit diagrams modeling the circuit shown in FIG. 2, where both branches are in an "OFF" state.

FIG. 3 shows the conventional circuit of FIG. 1 but with both branches in an OFF state. The FETs 13 and 20 in branch 11 each contribute a junction capacitance C, which reduces to C/2. Likewise, the junction capacitance C of each of FETs 17 and 22 in branch 15 combine to equivalent capacitance C/2. As is shown in the last stage of simplification, the impedance seen at input 12 of the OFF circuit is C. In FIG. 4, which is the circuit shown in FIG. 2 but with both branches OFF, the junction capacitance contributed by large common switching FET 19 is 2C. Branch FETs 20 and 22 each show junction capacitance C. This reduces, as is shown in middle diagram 24, to two capacitances in series each having a value of 2C. Simplified diagram 28 shows that this reduces to an input impedance of C as seen from port 12. In the OFF state, therefore, the conventional and cascaded methods yield the same impedance results.

Figure 5:
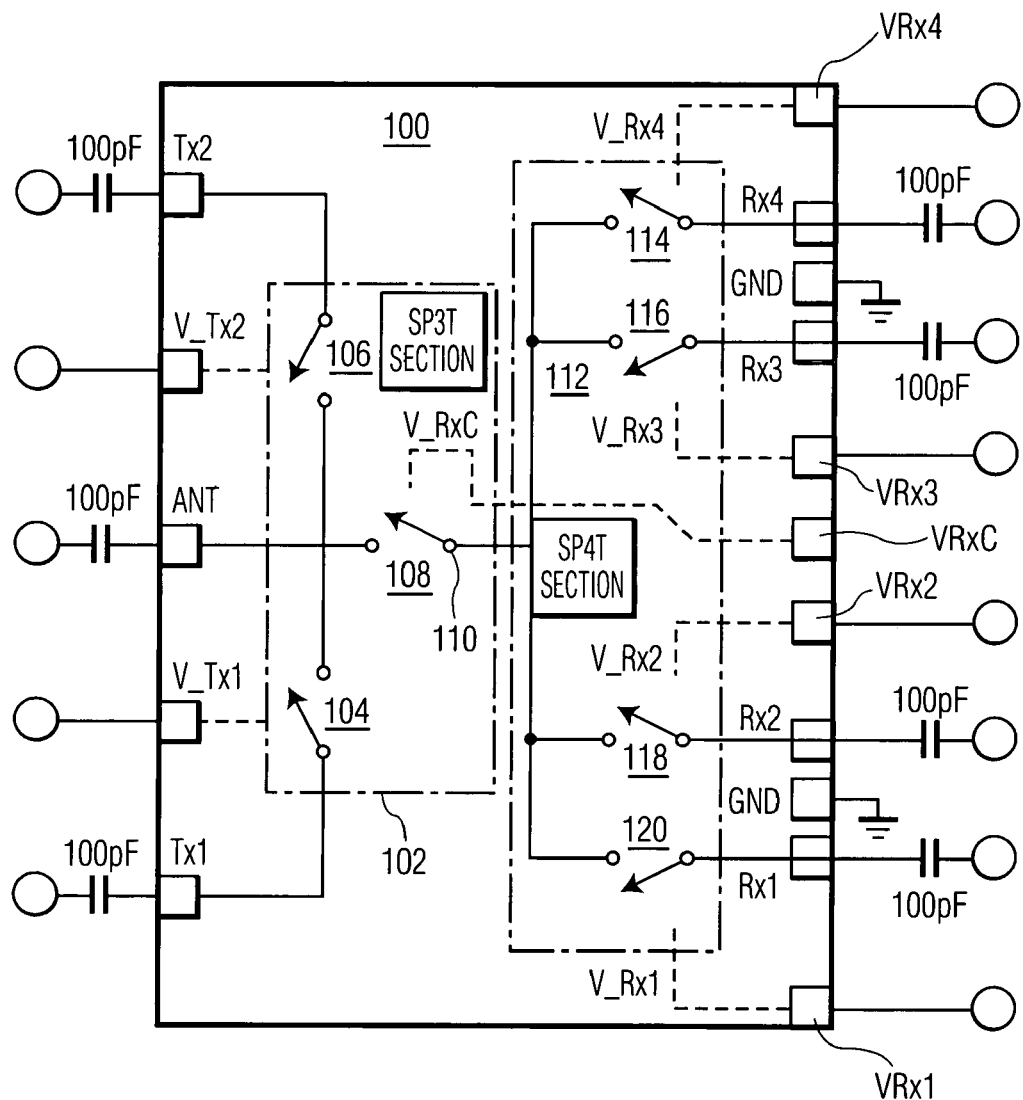
FIG. 5 is schematic electrical circuit diagram of a single-die integrated circuit for switching a plurality of transmitter and receiver ports to and from an antenna port according to one embodiment of the invention.

FIG. 5 is a schematic layout of a cascaded-branch integrated circuit according to one embodiment of the invention. The present embodiment is fabricated on a single integrated circuit chip or die 100. Chip 100 has a plurality of signal and control ports/bonding pads at its outer margins.

In the illustrated embodiment, the transmitter ports are arranged along one side of the die, while the receiver ports are arranged along an opposite side of the die. The transmitter ports include ports Tx2 and Tx1. The loads connected to these ports are modeled as 100 picofarad capacitors. Respectively associated with the transmitter ports Tx1 and Tx2 are transmitter switching signal lines VTx1 and VTx2. The left side of the die also has an antenna port ANT to which one of the transmitter ports or one of the receiver ports is to be connected.

In the illustrated embodiment, the integrated circuit 100 includes a single pole, three throw (SP3T) switching section 102, the boundaries of which are shown in dotted and dashed line. In FIG. 5, the signal paths are shown in solid line while the switching control signal paths are shown in dotted line. Switching section 102 includes a switch 104 which is operable by control line VTx1 to connect transmitter port Tx1 to the antenna port ANT. A similar switch 106 is operable by switching signal VTx2 to connect transmitter port Tx2 to the antenna port ANT. A switch 108 is a first stage in a cascaded switching system and is operable by a receiver switching signal VRxC to connect a receiver signal node 110 to the antenna port ANT. While, in the illustrated embodiment, the integrated circuit 100 selectively switches one of two transmitter ports, the invention also contemplates embodiments having one or three or more transmitter ports.

The embodiment illustrated in FIG. 5 has four receiver ports Rx1, Rx2, Rx3 and Rx4, bonding pads for which are arranged along the right side (as seen in this Figure) of the die opposite the transmitter ports and the antenna port. A selected one of these receiver ports Rx1-Rx4 is switched by a single pole, four throw (SP4T) switching section 112. The switching section 112 is operable to switch one of four receiver ports Rx1-Rx4 to the node 110. In particular, the receiver switching section 112 includes a switch 114 operable by control voltage VRx4 to switch receiver port Rx4 to the node 110; switch 116 operable by switching voltage VRx3 to switch receiver port Rx3 to node 110; switch 118 operable by switching voltage VRx2 to switch receiver port Rx2 to node 110; and switch 120 operable by switching voltage VRx1 to switch receiver port Rx1 to node 110. One of the switches 114-120 is operated in conjunction with switch 108 to connect a selected one of the receiver ports to the antenna port ANT. As in the transmission ports, the receiver ports Rx1-Rx4 are modeled as including 100 picofarad external loads. Using a cascaded approach to switch the antenna ANT through two stages 108, 112 reduces the insertion loss suffered by a received signal. In the embodiment illustrated in FIG. 5, the circuit 100 switches one of two transmitter ports, or one of four receiver ports, to the antenna port, while isolating the rest. The number and kind of transmitter/receiver ports can be other than shown. Where a selected one of three or more transmitter ports is to be switched to the antenna port, a cascaded set of switches would be implemented for this, as is the case for the four receiver ports in this illustrated embodiment. A cascaded switching topology would likewise be used on the receiver side where one of three or more receiver ports is to be switched to the antenna port.

While in the illustrated embodiment a single integrated circuit has been provided to switch one of four receiver ports or one of two transmitter ports to the antenna port, the number of receiver ports and/or the number of transmitter ports can be varied as desired, as the switching circuitry provided with each such port is largely modular. Further, the multiple-series-FET switching elements 104 and 106 are provided with the expectation that they will be switching signals of relatively high current to the antenna node for outbound, preferably wireless transmission. On the other hand, a signal sensed on the antenna will be weaker and therefore the switches 114-120 have a single FET each. The number and size of the switching transistors may be varied according to the contemplated strengths of the signals they are meant to switch.

Figure 6:
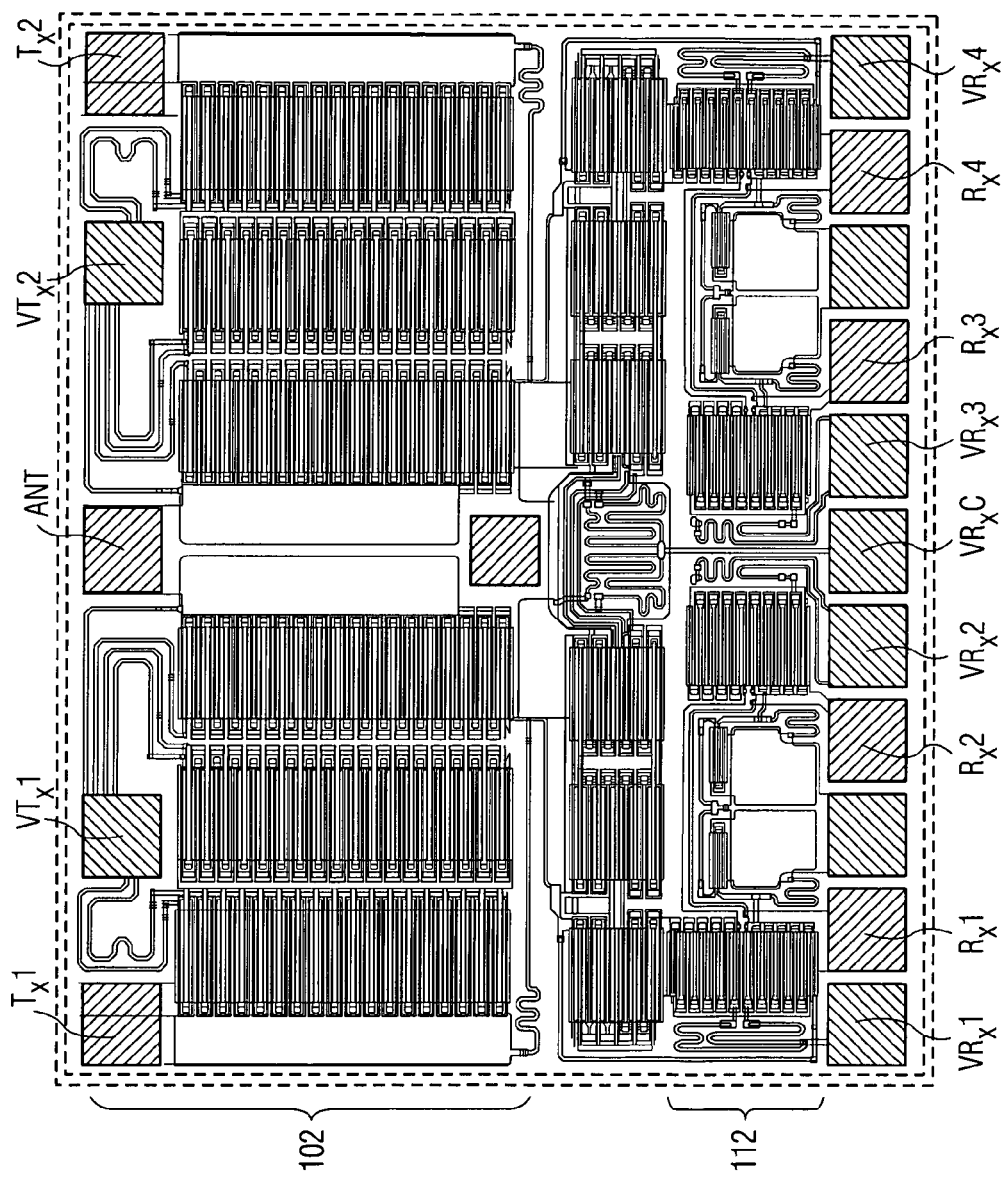
FIG. 6 is a plan view of a representative topological layout of the circuit illustrated in FIGS. 2 and 4.

FIG. 6 shows an exemplary layout and topography of an integrated switching circuit similar to that shown in FIG. 5. The FETs for switching transmitter signals Tx1 and Tx2 are shown at 102, while the receiver switching section is shown at 112. Each of the series switching FETs are high-power interdigitated switching transistors in which the sources and drains each have a plurality of fingers that are interleaved with each other. The interdigitated sources and drains may be created by suitable implants of a first conductivity type into a semiconductor substrate having an opposite conductivity type, and the implants may be self-aligned to the gates which are disposed between them. In the illustrated embodiment, the gates are sinuous metallizations, but in alternative embodiments the gates can be branched instead. The shapes of the channels of course correspond to the gates.

The second-stage receiver transistors in section 112 are smaller, in recognition that they have to switch signals of less power. The transistors are relatively small and in the illustrated embodiment have only one, noninterdigitated source and drain region apiece. The channels of the transistors are doped so as to be depletion-mode devices. The resistors can be created in a conventional manner, such as lines of polycrystalline silicon, and their values can be adjusted by adjusting their lengths.

In operation and referring to FIG. 5, the integrated circuit in the illustrated embodiment can operate in either of two transmission modes or any of four receiver modes. If, for example, a signal is to be transmitted from pad Tx1, VTx1 will be high, and VTx2, VRxC, VRx2, VRx1, VRx3 and VRx4 will be low. This turns on series transistor topology 104, and turns all other switching transistors off. In this condition the series transistor topology 104 will contribute a relatively low resistance to the insertion loss and the junction capacitance of the other, OFF branches of the circuit contribute little to the sensed impedance.

If a particular signal (say, one to appear on Rx3) is to be received, control signals VTx1, VTx2, VRx1, VRx2 and VRx4 will be low. Control signals VRx3 and VRxC will be high, turning on transistor topology 108 and transistor 116. The ON transistors 108, 116 will contribute a relatively low amount of resistance to overall signal insertion loss; the relatively high junction capacitances contributed by the OFF branches are neglected. Hence, the cascaded circuit topology exhibits less signal insertion loss than the conventional non-cascaded topology.

In summary, a single-die integrated circuit has been shown and described in FIGS. 5 and 6 which can be used to switch a plurality of wireless signals to and from an antenna. The described IC arranges its switching FETs in a cascaded topology, as is illustrated in FIGS. 2 and 4, in order to reduce insertion loss in the strength of the switched signals. This reduced insertion loss resulting from the cascaded topology enables a single die design in which receiver and transmission ports appear on the same die. In contrast, prior art IC's that arrange their switching FETs using a conventional topology, as shown in FIGS. 1 and 3, are required to provide receiver and transmission portions on separate dies, to avoid insertion loss and high capacitive loading. The integrated circuit in accordance with embodiments of the present invention is useful for switching signals in CDMA, w-CDMA, IEEE 802.11, Bluetooth and like wireless protocols and saves space in comparison to chips which handle transmission or reception alone. While preferred embodiments of the present invention have been illustrated in the appended drawings and described in the detailed description above, the present invention is not limited thereto but only by the scope and spirit of the appended claims.

I claim:

1. A single-die integrated circuit for switching among a plurality of transmission ports and a plurality of receiver ports, comprising:
    a transmitter switching section having a plurality of transmission ports, the transmitter switching section operable to switch a selected one of the plurality of transmission ports to a transmission node; and
    a receiver switching section having a plurality of receiver ports, the receiver switching section operable to switch a selected one of the plurality of receiver ports to the transmission node, wherein the receiver switching section includes at least two cascaded stages, a first cascaded stage controllable to switch the transmission node to a receiver node, and a second cascaded stage controllable to switch the receiver node to a selected one of the plurality of receiver ports.

2. The integrated circuit of claim 1, and further comprising an antenna port coupled to the transmission node.

3. The integrated circuit of claim 1, wherein, for each transmission port, the transmitter switching section includes a series field effect transistor (FET) switching topology comprising a plurality of transistors with their current paths coupled in series between an associated transmission port and the transmission node.

4. The integrated circuit of claim 3, wherein at least one of the FET switching topologies includes at least one FET having a plurality of contiguous source regions interdigitated with a plurality of contiguous drain regions, and a sinuous gate formed to wind between the source regions and the drain regions.

5. The integrated circuit of claim 1 wherein the first cascaded stage comprises at least one first transistor having a current path coupled between the transmission node and an intermediate node and the second cascaded stage comprising at least one second transistor for each of the receiver ports, said transistor of each of the receiver ports having a current path coupled between the intermediate node and the corresponding receiver node, wherein the at least one transistor has a gate perimeter that is about twice the gate perimeter of at least one of the second transistors.

6. A single-die multiband switch for wireless communication, comprising:
    an antenna port;
    a plurality of transmitter ports, for each transmitter port a switching topology operable to switch the last said transmitter port to the antenna port; and
    a plurality of receiver ports, for each receiver port a switching topology operable to switch the last said receiver port to the antenna port;
    wherein at least one of the switching topologies comprises a plurality of field effect transistors having their current paths coupled in series between an associated transmission port and the antenna port, a control signal for the at least one switching topology controlling the at least one switching topology to selectively connect or isolate a respective transmitter port from the antenna port.

7. The switch of claim 6, wherein at least one of the switching topologies comprises at least one interdigitated field effect transistor having a plurality of elongated contiguous drain regions, a plurality of elongated contiguous source regions interdigitated with the drain regions, an elongated sinuous channel region spacing apart the drain regions from the source regions, and a gate overlying the channel region to switch the interdigitated field effect transistor between an ON and an OFF state.

8. The switch of claim 6, wherein the die has an area, the transmitter port switching topologies occupying an area on the die which is substantially larger than the receiver port switching topologies.

9. The switch of claim 6, and further including at least one multiple-stage switching topology, a first stage of the multiple-stage switching topology selectively connecting or isolating the antenna port from the multiple-stage switching topology, a last stage of the multiple-stage switching topology selectively connecting or isolating a plurality of other ports from the multiple-stage switching topology.

10. The switch of claim 9, wherein the other ports are receiver ports.

11. The switch of claim 10, wherein the last stage includes, for each receiver port, a signal path FET having a current path controllable to connect the receiver port to an intermediate node, the first stage operable to connect the intermediate node to the antenna port.

12. A single-die transmitter/receiver integrated switching circuit, comprising:

a plurality of transmitter ports;

a plurality of receiver ports;

at least one antenna port;

a plurality of integrated circuit switching elements controllable to connect one of the transmitter ports or one of the receiver ports to the antenna port while isolating the remaining ones of the transmitter and receiver ports from the antenna port, at least one of the plurality of transmitter ports and the plurality of receiver ports being at least three in number, at least some of the integrated circuit switching elements arranged in cascaded fashion in order to reduce signal insertion loss.

13. The integrated switching circuit of claim 12, wherein there are at least three receiver ports, any one receiver port selectably switched to be connected to the antenna port through at least two cascaded stages of integrated circuit switching elements.

14. The integrated switching circuit of claim 12, wherein the integrated circuit switching elements are field effect transistors.

15. A method of switching one of a plurality of transmitters and a plurality of receivers to a transmitter/receiver antenna, comprising the steps of:

connecting each transmitter to a respective one of a plurality of transmitter ports formed on a single integrated circuit die;

connecting each receiver to a respective one of a plurality of receiver ports formed on the die;

controlling a selected one of a plurality of switching topologies each associated with a respective one of the transmitter and receiver ports to connect a respective selected one of the transmitter and receiver ports to an antenna port formed on the die;

controlling other ones of the switching topologies to isolate others of the transmitter and receiver ports from the antenna port;

arranging at least some of the switching topologies in cascaded stages including a first stage coupled to the antenna port and a last stage coupled to a plurality of the transmitter or receiver ports;

connecting a selected one of the transmitter or receiver ports to the antenna port by switching on the first stage and switching on a switch associated with the selected one of the transmitter or receiver ports wherein the switch associated with the selected one of the transmitter or receiver ports is a portion of the last stage; and switching off the remaining switching topologies and other switches in the last stage.

16. The method of claim 15, wherein the step of controlling a selected one of the switching topologies includes the step of switching a plurality of series-connected switching transistors to an ON state.

\* \* \* \* \*